United States Patent [19]

Krider et al.

[11] 4,245,190

[45] Jan. 13, 1981

[54] LIGHTNING DETECTION SYSTEM UTILIZING TRIANGULATION AND FIELD AMPLITUDE COMPARISON TECHNIQUES

[75] Inventors: Edmond P. Krider; Ralph C. Noggle, both of Tucson, Ark.; Martin A. Uman, Gainesville, Fla.

[73] Assignee: Lightning Location and Protection, Inc., Tucson, Ariz.

[21] Appl. No.: 968,665

[22] Filed: Dec. 12, 1978

[51] Int. Cl.³ ............................................. G01R 31/02
[52] U.S. Cl. .................................... 324/72; 324/77 R
[58] Field of Search ............. 324/72, 77 R; 73/170 R; 340/201 R

[56] References Cited

U.S. PATENT DOCUMENTS

| | | | |
|---|---|---|---|
| 3,611,365 | 10/1971 | Lundquist | 324/72 |
| 3,715,660 | 2/1973 | Ruhnke | 324/72 |
| 3,790,884 | 2/1974 | Kohl | 324/72 |
| 4,023,408 | 5/1977 | Ryan et al. | 324/72 |
| 4,115,732 | 9/1978 | Krider et al. | 324/77 R |

Primary Examiner—Michael J. Tokar
Attorney, Agent, or Firm—Mason, Kolehmainen, Rathburn & Wyss

[57] ABSTRACT

A lightning detection system utilizes a plurality of remotely located lightning detectors that provide information defining the azimuth of a lightning discharge to ground as well as information defining the strength of the electric and/or magnetic field produced by the lightning discharge to a central office. The central office includes a position analyzer for processing the data to determine the position of the discharge. The position analyzer utilizes either the received angle information and triangulation techniques, or the relative amplitudes of the fields to determine position, depending on whether or not the discharge occurs along or near a line joining two of the remotely located detectors.

3 Claims, 6 Drawing Figures

LIGHTNING DETECTION SYSTEM UTILIZING TRIANGULATION AND FIELD AMPLITUDE COMPARISON TECHNIQUES

BACKGROUND OF THE INVENTION

1. Field of the Invention

The present invention relates generally to lightning detection systems, and more particularly, to lightning detection systems utilizing one or more remotely located electric field and/or magnetic field detecting lightning detectors for determining the location of a lightning discharge to ground.

2. Description of the Prior Art

Magnetic and/or electric field detecting lightning detection systems are known. Such systems generally employ one or more detectors that detect the amplitude and azimuth of the field produced by a lightning discharge to ground. When only a single detector is employed, the relative amplitudes of the east-west and north-south components of the field determine the azimuth of the discharge and the amplitude of the field determines the distance to the discharge, with the distance being inversely related to the amplitude of the field. When multiple detectors are employed, the location is generally computed from the azimuth information provided by the various detectors utilizing triangulation techniques.

While the above-mentioned systems do provide a way to determine the locations of lightning discharges with some degree of accuracy, variations in the amplitudes of the fields produced by different discharges limits the accuracy with which the range may be calculated. Multiple detector systems utilizing azimuth angles and triangulation techniques are not dependent on the strength of the field produced by the discharge, but are not very accurate when the discharge occurs along or near an imaginary line passing through two of the detectors.

SUMMARY OF THE INVENTION

Accordingly, it is an object of the present invention to provide an improved lightning detection system that overcomes many of the disadvantages of the prior art systems.

It is another object of the present invention to provide an improved lightning detection system that provides greater position accuracy than the prior art systems.

It is yet another object of the present invention to provide a lightning detection system that accurately defines the position of lightning discharges to ground regardless of the amplitude of the field produced by the lightning discharge and the location of the discharge.

Briefly, in accordance with a preferred embodiment of the invention, the system utilizes a plurality of detectors, with each detector providing both azimuth and field amplitude information to a central location. The central location includes an azimuth analyzer that examines the azimuths of the discharges detected by the various detectors to determine whether the discharge occurred at or near an imaginary line connecting two of the remotely located detectors. If the discharge did not occur along such a line, the position of the discharge is calculated from the azimuth information utilizing triangulation techniques. However, if the discharge did occur along or near such a line, the position is calculated from the relative amplitudes of the fields detected by the two detectors. Thus, the ambiguities that previously occurred when a discharge was located at or near such a line are eliminated. Moreover, the system is not amplitude sensitive since the relative field strengths, rather than an absolute field strength, are used in the calculation.

BRIEF DESCRIPTION OF THE DRAWING

These and other objects and advantages of the present invention will become readily apparent upon consideration of the following detailed description and accompanying drawing wherein.

DETAILED DESCRIPTION OF THE PREFERRED EMBODIMENT

Figure 1:
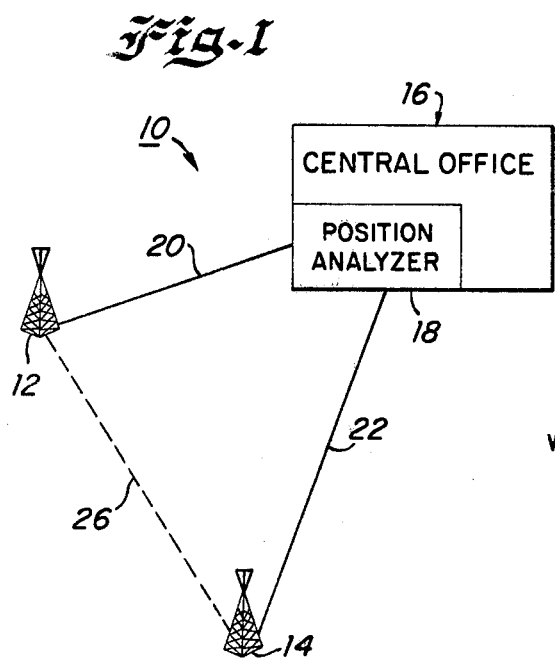
FIG. 1 is a diagram showing the general configuration of the system according to the invention.

Referring now to the drawing, with particular attention to FIG. 1, there is shown a system according to the invention generally designated by the reference numeral 10. The system utilizes a pair of remotely located detectors 12 and 14 that are connected to a central office 16 that includes a position analyzer 18 by a pair of communication links such as, for example, a pair of telephone lines 20 and 22. The two detectors 12 and 14 detect the magnetic and/or electric fields produced by lightning discharges and provide information defining the azimuth of the discharge and the amplitude of the received field to the central office 16 for further analysis. An example of a lightning detector suitable for use as the detectors 12 and 14 is disclosed in U.S. Pat. No. 4,115,732, issued to the same inventors as the inventors of the present invention, and incorporated herein by reference.

Figure 2:
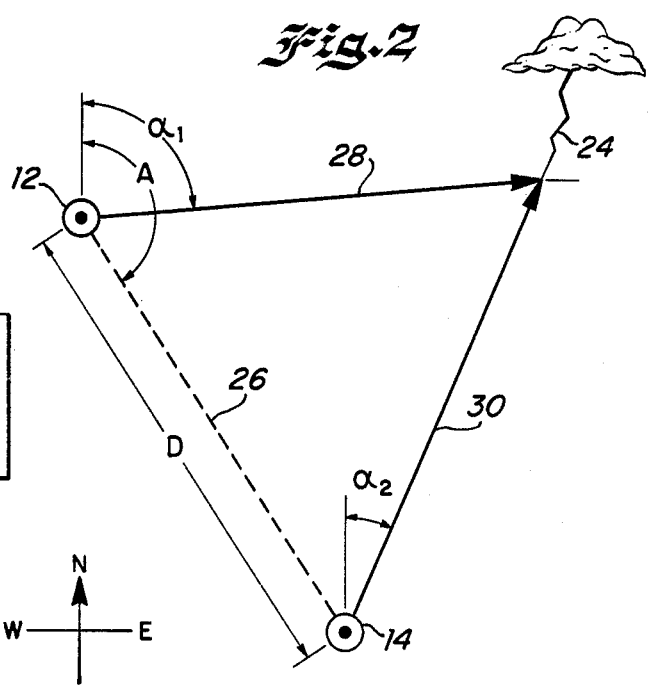
FIG. 2 is a diagram showing how the position of a lightning discharge to ground may be calculated utilizing triangulation techniques.

When a discharge 24 occurs (FIG. 2), the azimuth angles $\alpha_1$ and $\alpha_2$ of the discharge 24 with respect to the detectors 12 and 14, respectively, can be determined from the ratios of the east-west and north-south components of the field in the manner described in the aforesaid U.S. Pat. No. 4,115,732. This information, as well as information defining the amplitude of the field detected by the detectors 12 and 14 is transmitted to the central office 16 via the telephone lines 20 and 22. The central office 16 utilizes a microprocessor that stores the received information and utilizes it along with other information, such as information defining the distance D between the remote detectors 12 and 14 as well as the angle A defining the angle of offset between the two sites. From the aforesaid azimuth angles $\alpha_1$ and $\alpha_2$ and the detector location information defined by the angle A and the distance D, the position of the discharge 24 can readily be calculated.

Figure 3:
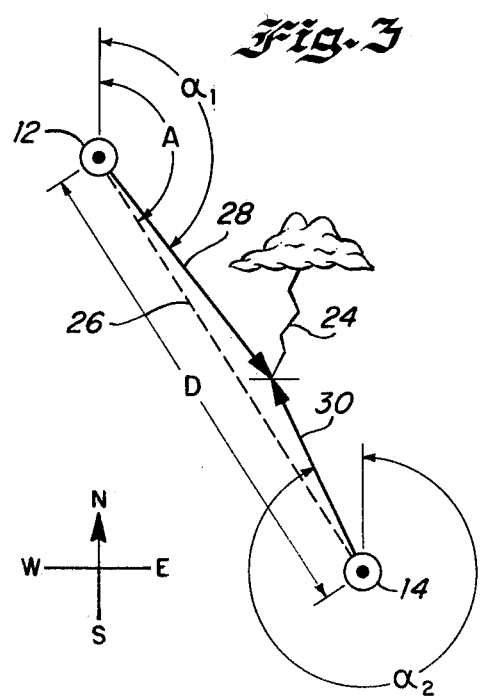
FIGS. 3 and 4 illustrate the ambiguities that can occur in triangulation systems when the lightning discharge occurs at or near a line connecting two of the detectors.
Figure 4:
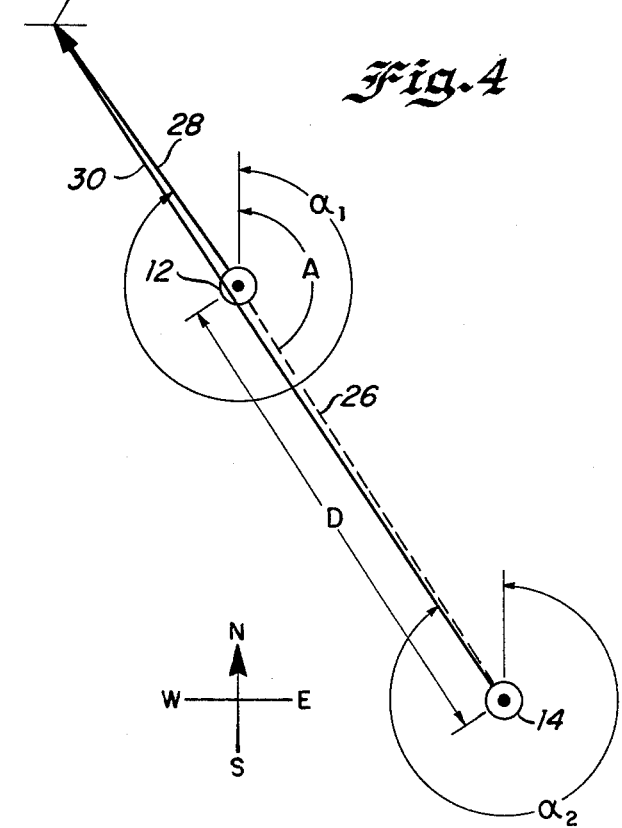

However, if the discharge occurs at or near an imaginary line such as a line 26 passing through the detectors 12 and 14, as illustrated in FIGS. 3 and 4, it becomes difficult to determine the position of the discharge accurately with triangulation techniques since a small error in either of the azimuth angles $\alpha_1$ or $\alpha_2$ will result in a large change in the position of the intersection of the vectors 28 and 30. The vectors 28 and 30 may even be parallel, and not intersect at all, or colinear and lie on top of each other. In order to avoid this problem, such a condition is sensed by the position analyzer 18, and the position of the discharge 24 is computed from the relative amplitudes of the fields detected by the detectors 12 and 14 when such a condition is sensed.

The central office 16 (FIG. 5) includes a display 32, which may be a cathode ray tube display or a plotter as disclosed in U.S. Pat. No. 4,115,732, or any suitable display. The central office 16 also contains the position analyzer 18, which, for purposes of illustration, includes an azimuth analyzer 34, a pair of gates 36 and 38, an amplitude position analyzer 40 and an angle position analyzer 42. Amplitude and azimuth information, after being processed in a manner such as, for example, described in U.S. Pat. No. 4,115,732, is applied to the gates 36 and 38 and to the azimuth analyzer 34. The azimuth analyzer 34 determines whether or not the discharge occurred at or near the imaginary line 26 intersecting the two detectors 12 and 14. This is accomplished by analyzing the azimuth angles $\alpha_1$ and $\alpha_2$ to determine whether the vectors 28 and 30 are nearly or substantially parallel (or antiparallel). Such a parallel (or antiparallel) condition is evidenced when either $\alpha_1$ or $\alpha_2$ is equal to the angle A (FIG. 3), or when $\alpha_1$ is approximately equal to $\alpha_2$ (FIG. 4). In the present embodiment, if the vectors are within approximately 5 degrees of being parallel (or antiparallel), they are considered to be nearly or substantially parallel (or antiparallel); however, the optimum angle has not yet been determined, but is believed to be in the range of approximately 0° to 15°. If it is determined that the vectors 28 and 30 are nearly parallel (or antiparallel), the azimuth analyzer applies a signal to the gates 36 and 38 to permit the signals from the detectors 12 and 14 to flow through the gate 36 and into the amplitude position analyzer 40, which compares the amplitudes of the signals received by the detectors 12 and 14 in order to determine the location along the line 26 of the discharge 24. Since the distance to a discharge is inversely proportional to the received signal strength, the ratio of the distance between the discharge 24 and each of the detectors 12 and 14 is proportional to the inverse of the ratio of the signal strengths received by the respective detectors 12 and 14. The azimuth angles $\alpha_1$ and $\alpha_2$ are also compared with each other and the angle A to determine whether the discharge occurred between the two detectors 12 and 14 (FIG. 3), or outside the two detectors (FIG. 4).

Similarly, if the azimuth analyzer determines that the vectors 28 and 30 are not nearly parallel (or antiparallel), the gate 36 is closed, and the gate 38 is enabled to permit the information signals from the detectors 12 and 14 to be applied to the angle position analyzer 42 which determines the position of the discharge with triangulation techniques. The outputs of the amplitude position analyzer 40 and the angle position analyzer 42 are applied to the display 32 which displays the output of whichever of the two analyzers 40 and 42 is operative.

Figure 5:
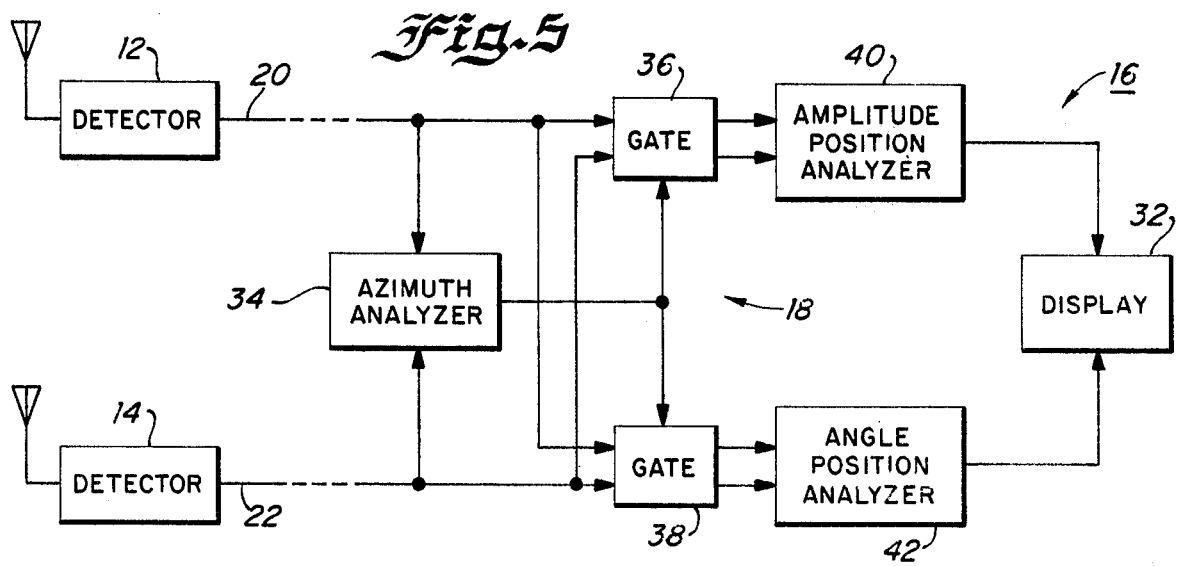
FIG. 5 is a generalized functional block diagram illustrating the operation of the system according to the invention.
Figure 6:
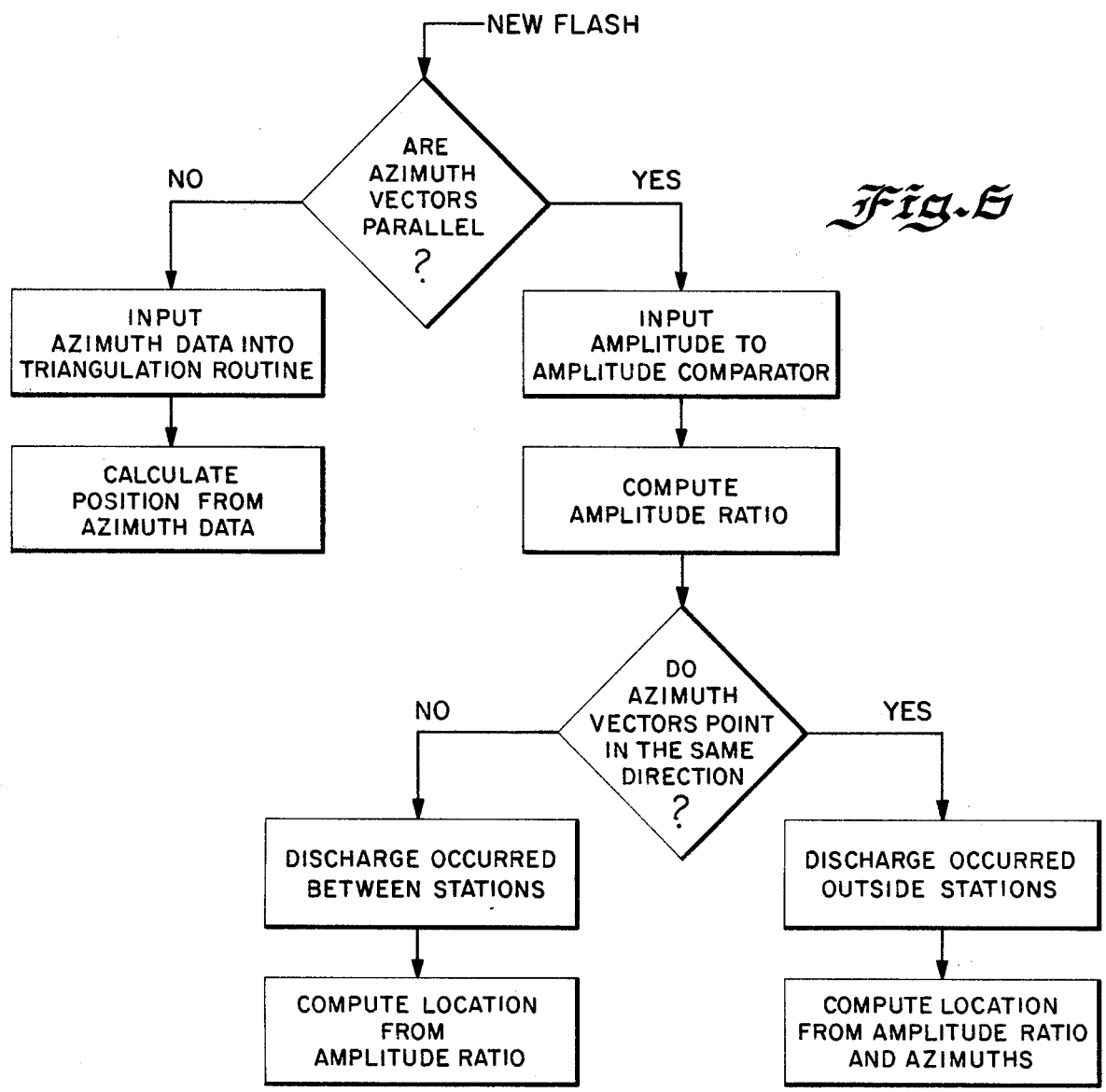
FIG. 6 is a flow chart describing the system logic.

In a practical system, the block diagram of FIG. 5 would be implemented by a microprocessor or the like, and a discrete component corresponding to each of the blocks would not necessarily be required, but rather, many of the functions could be combined and performed by the microprocessor. Although the program could take many different forms and many different languages could be employed, the basic approach would be similar to that illustrated in the flow chart of FIG. 6.

Each time a new flash is detected, validity checks such as those described in the aforesaid U.S. Pat. No. 4,115,732 are made, and a check is made to determine whether the flashes detected by the two detectors occurred simultaneously, the azimuth data is then analyzed to determine whether the azimuth vectors are nearly or substantially parallel. If they are not parallel within the predetermined tolerance (e.g., 0°-15°), the azimuth data is inputted into a triangulation routine and the position of the discharge is calculated from the azimuth data. On the other hand, if the vectors are substantially parallel (or antiparallel), the amplitude data is inputted into an amplitude comparator and the ratio of the field amplitudes is determined.

Since a discharge along parallel or colinear vectors can occur either between the two detectors as shown in FIG. 3 or along an extension of the imaginary line connecting the two detectors, the azimuth data must be analyzed to determine whether or not the vectors point in the same direction. If they do point in substantially the same direction, the discharge occurred outside the stations. The direction along the imaginary line is then determined from the azimuth information, and the location along the imaginary line is determined from the amplitude ratio. If the azimuth vectors do not point in the same direction, the discharge occurred between the stations and the location is calculated from the amplitude ratio.

The operation of the system according to the invention is described in much greater detail in the "LLP Model 80-02 Automatic Direction-Finding System for Lightning Discharges to Ground", Operating Service Manual, Revision A, 5/78 and "LLP Model 80-02 Automatic Locating System for Lightning Discharges to Ground", Operating Service Manual, 6/78, Lightning Location and Protection, Inc.; The system described in these Operating Service Manuals is generally functionally equivalent to the block diagram illustrated in FIG. 5. However, the block diagram of FIG. 5 has been significantly simplified to aid in the understanding of a relatively complex digital system, and is intended to illustrate function and not absolute hardware, which may vary, there may not be a complete one-to-one correspondence between the blocks of FIG. 5 and the system described in these Operating Service Manuals.

Obviously, many modifications and variations of the present invention are possible in light of the above teachings. Thus, it is to be understood that, within the scope of the appended claims, the invention may be practiced otherwise than as specifically described above.

What is claimed and desired to be secured by Letters Patent of the United States is:

1. A method of determining the location of a lightning discharge to ground comprising the steps of:
   detecting the field produced by the discharge at at least two remotely located sites and determining the amplitude of the field detected at each site as well as the relative direction of the discharge with respect to each site;
   comparing the relative directions to determine whether the discharge occurred along or near a line passing through said two detectors;

determining the location of the discharge with respect to said sites utilizing said relative directions and triangulation techniques if the discharge did not occur along or near said line; and determining the location of said discharge by comparing the relative amplitudes of the fields detected at each site if the discharge occurred along or near said line.

2. The method recited in claim 1 further including the step of further comparing the relative directions to determine whether or not the discharge occurred between the detectors when the discharge occurs along said line.

3. A lightning detector comprising:

first detecting means for detecting, with respect to said first detecting means, the azimuth angle of a lightning discharge to ground, said first detecting means including means for determining the amplitude of the field produced by said discharge, said first detecting means being operative to provide signals indicative of said azimuth angle and said amplitude;

second detecting means for detecting, with respect to said second detecting means, the azimuth angle of a lightning discharge to ground, said second detecting means including means for determining the amplitude of the field produced by said discharge, said second detecting means being operative to provide signals indicative of said azimuth angle and said amplitude;

means responsive to the azimuth signals provided by said first and second detecting means for providing a first signal if the azimuths provided by said first and second detecting means lie substantially along a common line, and for generating a second signal if said azimuths do not lie substantially along a common line;

means responsive to said first signal and said amplitude signals for determining the relative distances of said discharge from said first and second detectors when said azimuths lie substantially along a common line; and means responsive to said second signal and said azimuth signals for determining the location of said discharge when said azimuths do not lie substantially along the same line.

* * * * *